United States Patent [19]

Emanuel

[11] 4,091,662
[45] May 30, 1978

[54] APPARATUS FOR TESTING THE PERFORMANCE OF ELECTRIC MOTORS

[76] Inventor: Ervin Mitchel Emanuel, P.O. Box 2175, Prairie View, Tex. 77445

[21] Appl. No.: 816,386

[22] Filed: Jul. 18, 1977

[51] Int. Cl.² .............................................. G01D 1/16
[52] U.S. Cl. ................................ 73/116; 324/158 MG
[58] Field of Search .................. 73/116; 318/434, 490; 324/158 MG

[56] References Cited

U.S. PATENT DOCUMENTS

| | | | |
|---|---|---|---|
| 3,525,026 | 8/1970 | Ahamed | 318/490 X |
| 3,596,511 | 8/1971 | Hart | 73/116 X |

*Primary Examiner*—Jerry W. Myracle
*Attorney, Agent, or Firm*—Larry Harbin

[57] ABSTRACT

Apparatus for testing the performance of electrical machines by producing a direct digital readout and display of per unit rotor slip in electrical motors from no load condition through loads in excess of maximum rated load. The apparatus includes speed sensing means for detecting the rotor speed of the motor under test and means for producing a voltage output that is proportional to the rotor speed. A reference voltage is developed by sensing the frequency of the input voltage to the motor under test. The difference between these two signals, representing the actual rotor speed and the synchronous rotor speed, is divided by the reference voltage to produce the per unit slip of the motor under test.

9 Claims, 2 Drawing Figures

APPARATUS FOR TESTING THE PERFORMANCE OF ELECTRIC MOTORS

BACKGROUND OF THE INVENTION

1. Field of the Invention

This invention relates to testing apparatus, and, more particularly to apparatus used for determining the various characteristics of electrical motors during starting and running.

2. Description of the Prior Art.

Within the past two decades, the field of electrical power has undergone several remarkable changes. The development and use of integrated circuits led to the construction of systems such as minicomputers which are becoming less expensive, occupy little space, and are controlling many tests as well as performing calculations. The expanded use of electronic digital instrumentation and solid state power devices such as thyristors and power transducers, accelerates the development of more sophisticated equipment and measuring techniques for determining an electrical machine's overall performance.

In the prior art U.S. Pat. No. 3,052,117 motor testing apparatus is disclosed wherein a constant voltage source is required as input to the motor under test and its rotor speed is sensed using a DC tachometer generator. The DC tachometer generator produces an output signal which is linearly proportional to its rotational speed. This signal is used to obtain speed and torque characteristics of the motor under test. However, the prior art patent does not address the important motor performance characteristic known as "slip." Slip is the difference between designed synchronous rotor speed and the actual rotor speed of a motor and is usually expressed in percent of synchronous rotor speed or by a per unit representation. The technique used for measuring motor characteristics in the U.S. Pat. No. 3,052,117 patent will not produce an acceptable slip measurement because of the testing apparatus used. The DC tachometer generator used to provide an output voltage proportional to the rotor speed of the motor under test will cause a wide variation in slip characteristic due to a one percent error in the accuracy of the tachometer generator. The inability of a DC tachometer generator to maintain an acceptable output voltage proportional to speed is caused by the variation of brush contact due to uneven commutator surface and variation in brush tension.

SUMMARY OF THE INVENTION

This invention provides an accurate means for measuring rotor slip in an electrical motor. A DC voltage proportional to the rotor speed of the motor under test is produced indirectly by using an AC synchronous tachometer generator to sense the rotor speed of the motor and produce a signal whose frequency is proportional to the rotor speed. A frequency transducer converts the output of the AC tachometer generator into a constant DC current output. A second frequency transducer is used to monitor the frequency of the input voltage to the motor under test and to produce a reference voltage. The reference voltage and the voltage derived from the frequency output of the tachometer generator are amplified and their difference is taken. This difference is divided by the reference signal to produce a per unit measurement of slip.

DETAILED DESCRIPTION

Figure 1:
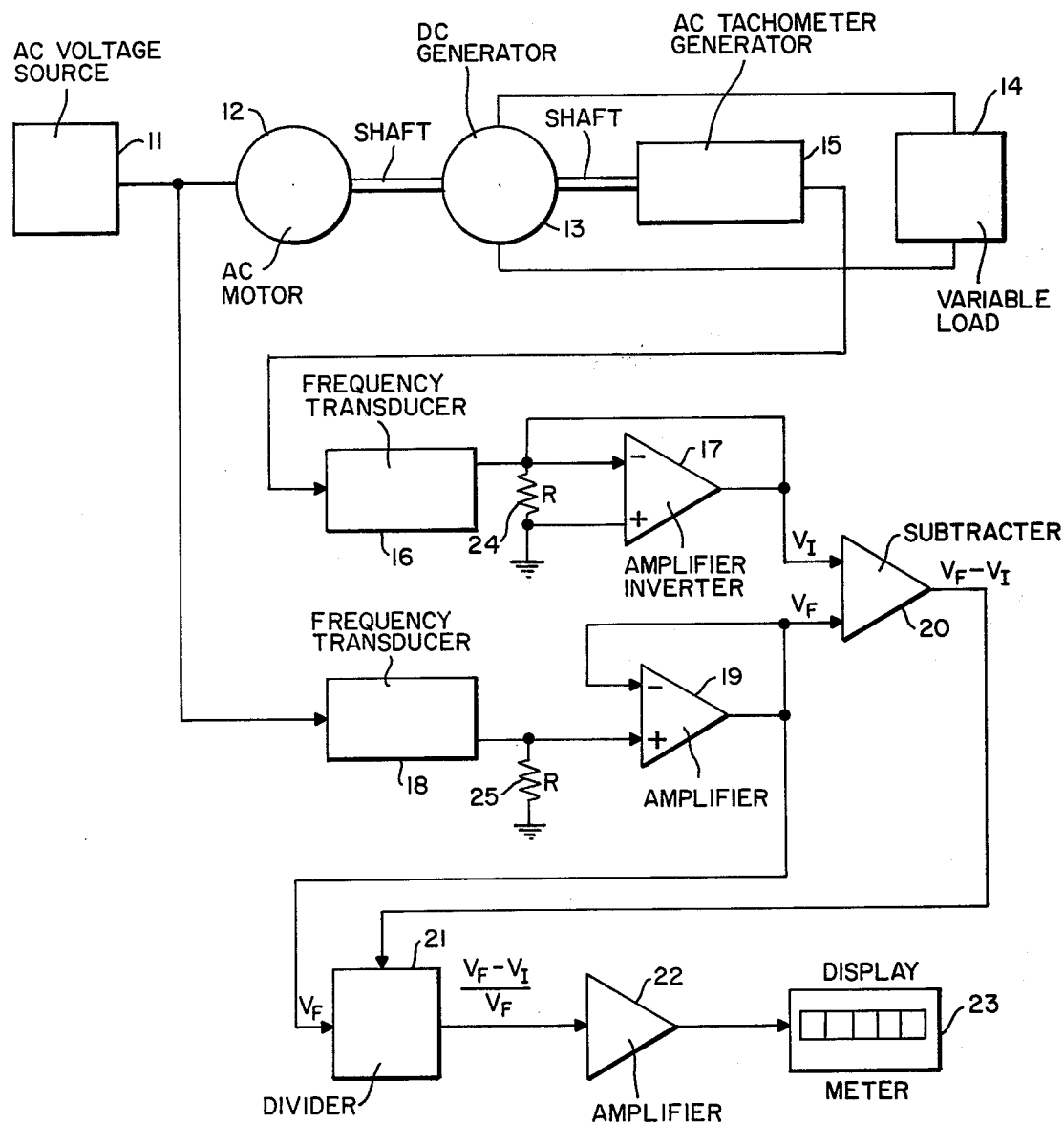
FIG. 1 is a circuit schematic of apparatus for determining per unit slip of the rotor of an electrical motor.

Referring now to FIG. 1, there is shown an overall schematic diagram of a circuit for measuring per unit slip of an electric motor. The motor 12 has its input connected to a source of alternating current voltage 11. The output of the motor 12 is directly coupled to a self-excited DC shunt generator 13 which is used to load the motor 12. A variable load 14 is connected across the output windings of the DC generator 13. The variable load 14 may simply be a rheostat capable of varying the resistance across the output windings of the generator 13. As the resistance across the output windings of the generator is reduced, the load current on the generator increases and, correspondingly, the load on the AC motor 12.

An AC tachometer generator 15 is mechanically coupled to the shaft of the DC generator 13. The tachometer generator 15 is connected to the shaft of the generator 13 as a matter of convenience and could be connected to the shaft of the test motor 12 without affecting the operation of the invention. Suitable AC tachometer generators for use in this test circuit are widely available commercially as off-the-shelf items. The AC tachometer generator chosen in the preferred embodiment of this invention is a 60 hertz, 1800 rpm, 4 pole, 125 volt AC synchronous generator with a permanent magnet rotor. The magnetic interaction between the rotor and its stator coils produces an AC voltage at the stator terminals having a magnitude and frequency which are both proportional to rotor speed. Frequency, number of poles, and speed are related to each other by the expression, rpm = $120f/p$, where rpm is speed, $f$ is frequency, $p$ is number of poles. In this application, it is advantageous to operate with variations of frequency rather than voltage level since frequency is unaffected by circuit impedance, loading, and temperature.

A precise frequency transducer 16 is electrically connected to the output of the AC tachometer generator 15. The frequency transducer 16 accepts frequency as its input and provides a constant DC current output into a variable impedance load with a 0.02% load resistance effect. By using a 10k ohm resistor 24, a 0-5 volt DC signal is available at the output of the frequency transducer 16 with 0.02% linearity and 0.5% accuracy when 55-60 hertz is present at the input. A second frequency transducer 18 with a similar load resistor 25 is used to monitor the input line frequency to the test motor 12. An example of a suitable precision frequency transducer for use in this test circuit is the Series FCX-1 Frequency Transducer manufactured by Rochester Instrument Systems, Inc.

The AC tachometer generator frequency signal and the reference frequency signal are converted to proportional DC levels by transducers 16 and 18 whose outputs are connected to high gain operational amplifiers 17 and 19 respectively. The amplifiers 17 and 19 are connected with negative feedback to enhance stability. To use an operational amplifier without feedback in an instrumentation chain would require continual recalibration of the system, but by using negative feedback on the amplifier, gain is made largely dependent on stable passive components and independent of the gain of the amplifier.

The output of frequency transducer 16 is connected to the negative input of operational amplifier 17 which produces the signal $V_I$ at its output having a negative polarity when the output of the frequency transducer 16 is positive. In this configuration, operational amplifier 17 is used to invert its input signal. The output of frequency transducer 18 is connected to the positive input of the operational amplifier 19 which follows the polarity of its input.

The outputs of operational amplifiers 17 and 19 are connected to the input of subtractor 20. Subtractor 20, in the preferred embodiment, is a third operational amplifier which preforms the subtractions by adding the two input signals which are of opposite polarity. It will be understood that operational amplifiers 17 and 19 could be connected in such a fashion as to produce output signals of the same polarity and that other means could be used to subtract the two signals without departing from the scope of this invention.

The output of amplifier 19 is also connected to the divisor input of the divider 21. The output of subtracter 20 is connected to the dividend input of the divider 21. An example of a suitable precision divider circuit which can be used to perform the desired function is shown in the third edition of Motorola's *Linear Integrated Circuits Data* book published November, 1973. The output of the divider 21 has a voltage magnitude that is ten times the actual value. This output is connected to amplifier 22 where it is attenuated by a factor of 10. The output of the amplifier 22, whose value is equivalent to the per unit slip of the test motor 12, is connected to digital panel meter 23 for display.

Figure 2:
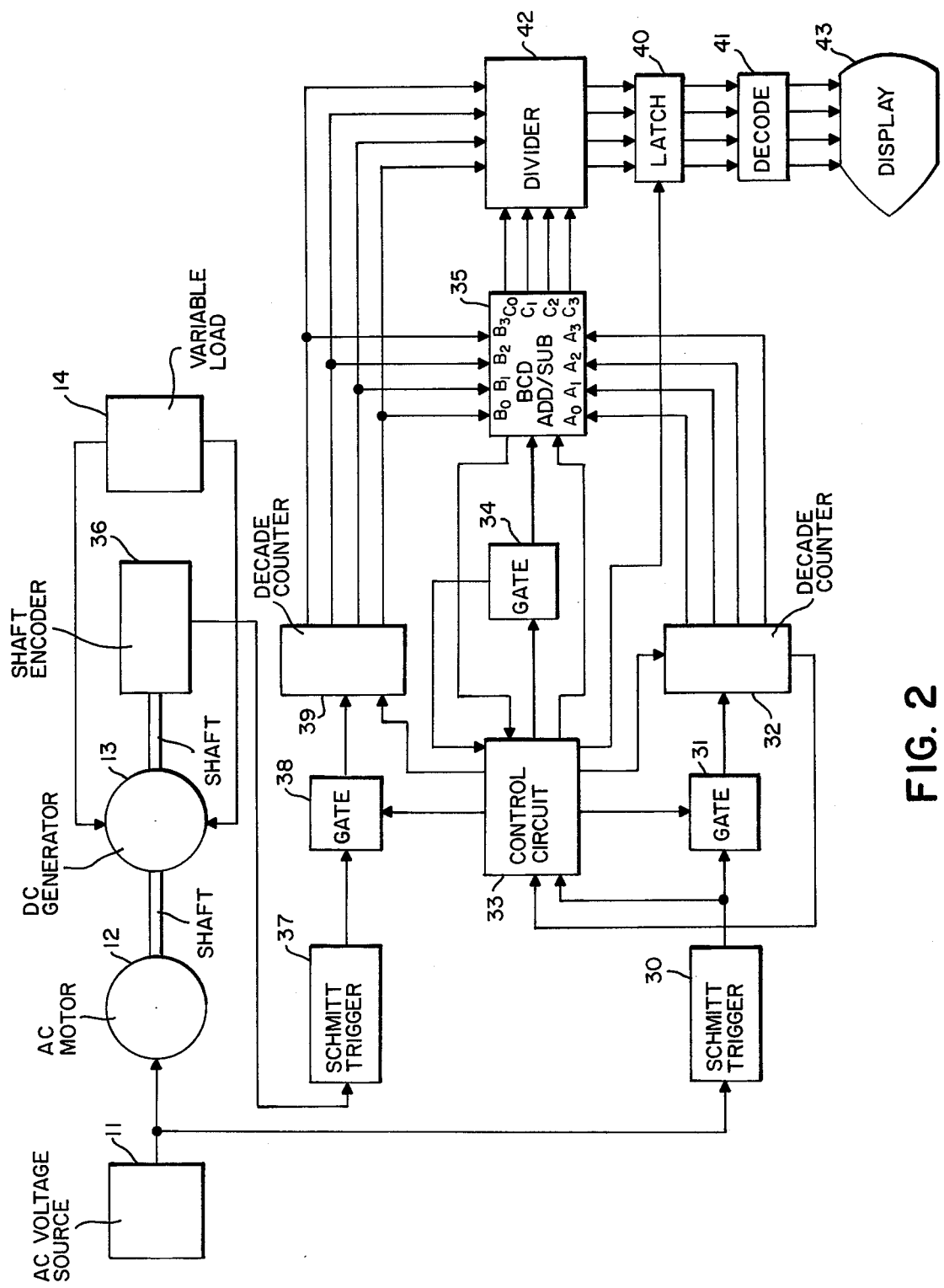
FIG. 2 is a circuit schematic of a completely digital apparatus for determining per unit slip.

Referring now to FIG. 2, there is shown apparatus for calculating per unit rotor slip of an AC motor using digital components only. The circuit shown employs a shaft encoder 36 to digitize the speed of the rotor. The shaft encoder 36 provides output pulses proportional to the number of revolutions of the rotor of the motor 12 under test. As in the embodiment of FIG. 1, the motor 12 under test has fixedly attached to its rotor shaft a DC generator 13 driving a variable load 14. The output signal of the shaft encoder 36 may be sinusodial or a square wave, depending on the type of encoder used. The number of pulses available per revolution range from 1 to 500. An example of a suitable shaft encoder which can be used is the combination of an emitter wheel having light and opaque areas about its periphery and a light emitting diode and photodiode placed on opposite sides of the emitter wheel for producing a pulse when one of the light areas is positioned between them.

The AC voltage source 11 is connected to a Schmitt trigger 30. The Schmitt trigger is a well known bistable circuit which can be set to change states on the slope of an input signal to produce a binary output signal. The Schmitt trigger 30 samples the input AC voltage source 11. A second Schmitt trigger 37 samples the output of the shaft encoder 36.

The output of Schmitt trigger 30 is connected to control circuit 33 and to gate 31. The control circuit 33 samples the output of Schmitt trigger 30 and opens gates 31 and 38 when the output of Schmitt trigger 30 is at the proper level, e.g., at binary one. Gates 31 and 38 connect the outputs of Schmitt triggers 30 and 37 respectively to decade counter modules 32 and 39. The decade counter modules 32 and 39 respectively are used to count the reference 60 hertz frequency signal and the actual speed of the test motor 12 that is proportional to the number of pulses generated by the shaft encoder 36 for a given time period. These counters 32 and 39 are gated on and off for a given time interval and reset by the control circuitry 33 when the required control sequence is completed. The decade counter modules 32 and 39 each contains four cascaded decade counters that provide two four digit BCD signals that are fed into the BCD adder/subtracter 35. The BCD adder/subtracter 35 adds and subtracts four BCD numbers in less than three miliseconds. The subtraction is accomplished by parallel loading of two four digit numbers in two sets of four cascaded up/down BCD decade counters. The two counters, A and B, are synchronously clocked together in the down count direction until the output of counter B reaches zero, and thus the desired difference is present in counter A. The output of counter A is labeled $C_0$, $C_1$, $C_2$, $C_3$ in FIG. 2.

After the subtraction is completed, the remainder is outputted to the divider 42 as the dividend for the divide operation to determine per unit slip. The divisor is derived from the synchronous speed of the motor 12 determined by the input AC voltage signal 11 and the decade counter 32. The output of the divider 42 is connected to latch module 40 for data storage. A decoder 41 decodes the data stored in the latch module 40 and drives a display 43 to produce a visible output of the per unit slip.

It will be seen that the foregoing invention provides testing apparatus for determining per unit slip in an electric motor very rapidly and very completely. However, it will be noted that the apparatus shown could be used to monitor the performance of an electric motor or generator and the output used to activate a control system to maintain the motor or generator at the optimum speed or voltage output with only minor modifications.

While this invention has been described using particular embodiments, it will be apparent that improvements and modifications may be made without departing from the scope of the invention as defined in the appended claims.

What is claimed is:

1. Apparatus for measuring rotor slip in an electric motor comprising:
   a source of alternating current voltage connected to the input of said motor for supplying power to said motor;
   a variable inertia load connected to the output of said motor;
   means connected to the output of said motor for producing a signal proportional to the actual rotor speed of said motor;
   means connected to said source of alternating current voltage for producing a signal proportional to the synchronous rotor speed of said motor;
   means for determining the difference between said signal proportional to the synchronous rotor speed of said motor and said signal proportional to the actual rotor speed of said motor; and
   means for dividing said determined difference by said signal proportional to the synchronous speed to produce a signal representing the per unit slip of said motor.

2. The apparatus of claim 1 wherein said means for producing a signal proportional to the actual rotor speed includes an alternating current tachometer generator connected to output of said motor for producing a signal having a frequency proportional to the rotor speed of said motor.

3. The apparatus of claim 2 wherein said means for producing a signal proportional to the actual rotor speed further includes a frequency transducer connected to the output of said alternating current tachometer generator for producing a direct current voltage proportional to the output frequency of the alternating current tachometer generator and said means connected to said source to alternating current voltage includes a frequency transducer for producing a direct current voltage proportional to the frequency of the source of alternating current voltage.

4. The apparatus of claim 3 further including means for displaying said signal representing per unit slip of said motor.

5. The apparatus of claim 4 wherein said means for displaying is a digital meter.

6. The apparatus of claim 1 wherein said means for producing a signal proportional to the actual rotor speed includes a shaft encoder connected to the output of said motor for producing a signal having a frequency proportional to the rotor speed of said motor and a counter for accumulating the revolutions of said rotor for a given time interval.

7. The apparatus of claim 6 wherein said means for producing a signal proportional to the synchronous rotor speed of said motor includes bistable means for producing a series of pulses proportional to the frequency of the source of alternating current voltage and a counter for accumulating a total of the series of pulses for a given time interval.

8. The apparatus of claim 7 further including means for displaying said signal representing per unit slip of said motor.

9. The apparatus of claim 8 wherein said means for displaying is a light emitting diode array.

* * * * *